(12) United States Patent
Maehara

(10) Patent No.: US 8,836,438 B2
(45) Date of Patent: Sep. 16, 2014

(54) OSCILLATOR ELEMENT AND METHOD FOR PRODUCING THE OSCILLATOR ELEMENT

(71) Applicant: Canon Anelva Corporation, Kawasaki (JP)

(72) Inventor: Hiroki Maehara, Tokyo (JP)

(73) Assignee: Canon Anelva Corporation, Kawasaki-shi (JP)

( * ) Notice: Subject to any disclaimer, the term of this patent is extended or adjusted under 35 U.S.C. 154(b) by 21 days.

(21) Appl. No.: 13/706,172

(22) Filed: Dec. 5, 2012

(65) Prior Publication Data

US 2013/0093529 A1    Apr. 18, 2013

Related U.S. Application Data

(63) Continuation of application No. PCT/JP2011/062709, filed on Jun. 2, 2011.

(30) Foreign Application Priority Data

Jun. 10, 2010 (JP) .................................. 2010-133008

(51) Int. Cl.
| | |
|---|---|
| H03B 5/40 | (2006.01) |
| H03B 15/00 | (2006.01) |
| H01L 29/82 | (2006.01) |
| H01L 43/08 | (2006.01) |
| H01L 43/12 | (2006.01) |

(52) U.S. Cl.
CPC ........ *H03B 5/40* (2013.01); *H01L 43/08* (2013.01); *H01L 43/12* (2013.01); *H01L 29/82* (2013.01); *H03B 15/006* (2013.01)
USPC ............... 331/94.1; 331/96; 331/157; 216/13

(58) Field of Classification Search
USPC .......... 216/13; 257/421–423; 331/3, 94.1, 96, 331/154, 157, 187; 360/324, 324.1, 324.11, 360/324.12, 324.2; 438/3
See application file for complete search history.

(56) References Cited

U.S. PATENT DOCUMENTS 5,675,295 A * 10/1997 Brebels et al. ................ 331/105
6,473,275 B1 * 10/2002 Gill ............................... 360/314
(Continued)

FOREIGN PATENT DOCUMENTS

| JP | 2006-295908 A | 10/2006 |
| JP | 2009-194906 A | 8/2009 |
| JP | 2011-101015 A | 5/2011 |

OTHER PUBLICATIONS

English Translation of International Preliminary Report on Patentability in Application No. PCT/JP2011/062709 (mailed Jan. 2013).

(Continued)

*Primary Examiner* — Levi Gannon
(74) *Attorney, Agent, or Firm* — Fitzpatrick, Cella, Harper & Scinto

(57) ABSTRACT

An oscillator element according to one embodiment of the present invention includes a magnetoresistive element having a magnetization free layer, magnetization fixed layer, and a tunnel barrier layer. Provided on the magnetization free layer are a protection layer and an electrode having a point contact section where the electrode is partially in electrical contact with the protection layers. An interlayer insulating film is provided between the electrode and the protection layer. The area of the interface between the magnetization free layer and the tunnel barrier layer is larger than the surface area of the point contact section. Moreover, a portion of the protection layer in contact with the interlayer insulating film has a smaller thickness in a surface normal direction than the portion of the protection layer in contact with the electrode.

6 Claims, 13 Drawing Sheets

(56) References Cited

U.S. PATENT DOCUMENTS

| | | | |
|---|---|---|---|
| 6,621,666 B2* | 9/2003 | Miyauchi et al. | 360/324.12 |
| 7,075,759 B2* | 7/2006 | Hasegawa et al. | 360/324.12 |
| 7,381,480 B2* | 6/2008 | Nakamura et al. | 428/811.5 |
| 7,471,491 B2* | 12/2008 | Sato et al. | 360/313 |
| 7,764,136 B2 | 7/2010 | Suzuki et al. | |
| 7,965,474 B2* | 6/2011 | Sato et al. | 360/324.12 |
| 8,013,408 B2 | 9/2011 | Maehara et al. | |
| 8,131,249 B2 | 3/2012 | Maehara | |
| 8,194,361 B2* | 6/2012 | Kudo et al. | 360/324.11 |
| 8,379,350 B2* | 2/2013 | Matsuzawa et al. | 360/324 |
| 2001/0021089 A1 | 9/2001 | Miyauchi et al. | |
| 2007/0153432 A1* | 7/2007 | Sbiaa et al. | 360/324.11 |
| 2009/0200264 A1 | 8/2009 | Cyrille et al. | |
| 2009/0322419 A1 | 12/2009 | Maehara et al. | |
| 2010/0264959 A1 | 10/2010 | Maehara | |
| 2011/0109397 A1 | 5/2011 | Delaet et al. | |

OTHER PUBLICATIONS

W. H. Rippard et al., "Current-driven Microwave Dynamics in Magnetic Point Contacts as a Function of Applied Field Angle," B 70 Phys. Rev. 100406(R) 1-4 (Sep. 2004).

Alina M. Deac et al. "Bias-driven High-power Microwave Emission from MgO-based Magnetoresistance Devices," 4 (10) Nature Physics 803-809 (Oct. 2008).

International Search Report in Application No. PCT/JP2011/062709 (Aug. 2011).

Office Action in Korean Application No. 10-2013-7000485 (May 27, 2014).

* cited by examiner

MILLING TIME (sec)

OSCILLATOR ELEMENT AND METHOD FOR PRODUCING THE OSCILLATOR ELEMENT

CROSS-REFERENCES TO RELATED APPLICATIONS

This application is a continuation application of International Application No. PCT/JP2011/062709, filed Jun. 2, 2011, which claims the benefit of Japanese Patent Application No. 2010-133008, filed Jun. 10, 2010. The contents of the aforementioned applications are incorporated herein by reference in their entireties.

TECHNICAL FIELD

The present invention relates to an oscillator element using a magnetoresistive element and a method for producing the oscillator element.

BACKGROUND ART

Recently, device applications utilizing magnetoresistance effect and spin-transfer torque have been under development. Spin-transfer torque is a magnetic torque acting on a local magnetic moment in a ferromagnetic material when angular momentum is transferred from conduction electrons to localized electrons along with passage of the spin-polarized current through a ferromagnetic material.

For example, for the application of a magnetoresistive element to an oscillator element, the magnetization of a magnetization free layer needs to reach a spontaneous oscillation state. To reach such a state, required are magnetization reversal induced by a spin-transfer torque generated by a DC bias, and an effective magnetic field in such a direction that the magnetization reversal is blocked. With the actions of the spin-transfer torque and the torque of the effective magnetic field competing against each other, the magnetic moment of the magnetization free layer reaches a state of continuing steady precession (spontaneous oscillation state). In the spontaneous oscillation state, the resistance value is periodically changed, and high-frequency signals are generated at both ends of the magnetoresistive element. Since the precession of magnetization is very fast, high-frequency signals having a frequency of several GHz to several tens of GHz can be obtained.

For practical application of an oscillator element operating on such a principle, the element needs to achieve both of a high Q factor of 100 or higher and a high oscillation output in the order of microwatts.

In order to achieve these, NPL 1 employs a point contact structure in which a nanoscale electrode is formed directly on a magnetoresistive thin film. This point contact structure is formed without etching of a magnetization free layer, and thereby is characterized in that: the structure has no shape magnetic anisotropy in the plane; the magnetization free layer is not physically or chemically damaged; and so forth. By employing this structure, a Q factor of approximately 18000 is obtained at maximum, and also a stable oscillation state having a Q factor at a level comparable with an oscillator circuit utilizing a quartz oscillator is obtained.

However, a GMR element is used as a magnetoresistive element in NPL 1. The GMR element has a low MR ratio, and is known to have difficulty obtaining a high oscillation output in the order of microwatts in principle.

To solve this problem, utilization of a TMR element having a high MR ratio is proposed as in NPL 2. However, both of a high Q factor and a high oscillation output have not been obtained yet.

CITATION LIST

Non Patent Literature

NPL 1: W. H. Rippard, et al. "Current-driven microwave dynamics in magnetic point contacts as a function of applied field angle," PHYSICAL REVIEW B70, 100406(R) (2004)

NPL 2: ALINAM. DEAC, et al. "Bias-driven high-power microwave emission from MgO-based tunnel magnetoresistance devices," Nature physics, 4, 803 (2008)

SUMMARY OF INVENTION

Unlike a GMR element, a tunnel magnetoresistive element having an insulator layer causes the following phenomena when employing a point contact structure as in NPL 1. Specifically, the insulator layer having a high resistance causes a current to scatter and flow laterally in a low-resistance metal protection film disposed on a magnetization free layer. In other words, the resulting structure has a form in which a parasitic resistance is inserted in parallel to the resistance components producing a magnetoresistance effect (ferromagnetic/tunnel barrier/ferromagnetic generating a tunneling current). This lowers a resistance value between electrodes of the oscillator element, and also lowers the magnetoresistance ratio.

The present invention has been made in view of the above-described problems. An object of the present invention is to provide: an oscillator element in which a tunnel magnetoresistive element using a high-resistance material such as an insulator for a non-magnetic layer in the magnetoresistive element is capable of achieving both a high oscillation output and a high Q factor; and a method for producing the oscillator element.

In order to achieve such an object, a first aspect of the present invention is a method for producing an oscillator element comprising the steps of: preparing a substrate having a magnetoresistive element having a magnetization free layer whose magnetization direction is variable, a magnetization fixed layer whose magnetization direction is fixed in one direction, and a tunnel barrier layer interposed between the magnetization free layer and the magnetization fixed layer, and a protection layer stacked on the magnetization free layer and configured to protect the magnetization free layer; forming a mask layer on a region of the protection layer having a smaller area than an interface between the magnetization free layer and the tunnel barrier layer; etching the protection layer using the mask layer as a mask in such a manner that the protection layer remains on an entire surface of the magnetization free layer, and that a region of the protection layer other than the region where the mask is formed has a smaller thickness in a stacking direction of the magnetoresistive element and the protection layer than the region of the protection layer where the mask is formed; forming an interlayer insulating film in such a manner as to cover at least a portion of the protection layer exposed by the etching; removing the mask layer; and forming an electrode in such a manner as to form a point contact section at a portion in contact with a region of the protection layer exposed by removing the mask layer.

A second aspect of the present invention is a method for producing an oscillator element comprising the steps of: preparing a substrate having a magnetoresistive element having a magnetization free layer whose magnetization direction is variable, a magnetization fixed layer whose magnetization direction is fixed in one direction, and a tunnel barrier layer interposed between the magnetization free layer and the magnetization fixed layer, and a protection layer stacked on the magnetization free layer and configured to protect the magnetization free layer; forming a mask layer on a region of the protection layer having a smaller area than an interface between the magnetization free layer and the tunnel barrier layer; etching the protection layer using the mask layer as a mask in such a manner that the protection layer remains on an entire surface of the magnetization free layer, and that a region of the protection layer other than the region where the mask is formed has a smaller thickness in a stacking direction of the magnetoresistive element and the protection layer than the region of the protection layer where the mask is formed; forming an interlayer insulating film in such a manner as to cover at least a portion of the protection layer exposed by the etching; removing the mask layer; and forming an electrode in such a manner as to form a point contact section at a portion in contact with a region of the protection layer exposed by removing the mask layer.

In the present invention, the area of the interface between the magnetization free layer and the tunnel barrier layer is larger than the area of the interface between the point contact section of the electrode and the protection layer; moreover, a portion of the protection layer in contact with the interlayer insulating film has a smaller thickness in the surface normal direction than a portion of the protection layer in contact with the electrode has. Hence, in the oscillator element using the magnetoresistive element in which a high-resistance material such as for example an insulator is used for a non-magnetic layer, quite a high Q factor can be achieved, and a high oscillation output of microwatts or more can be obtained.

DESCRIPTION OF EMBODIMENTS

Figure 1:
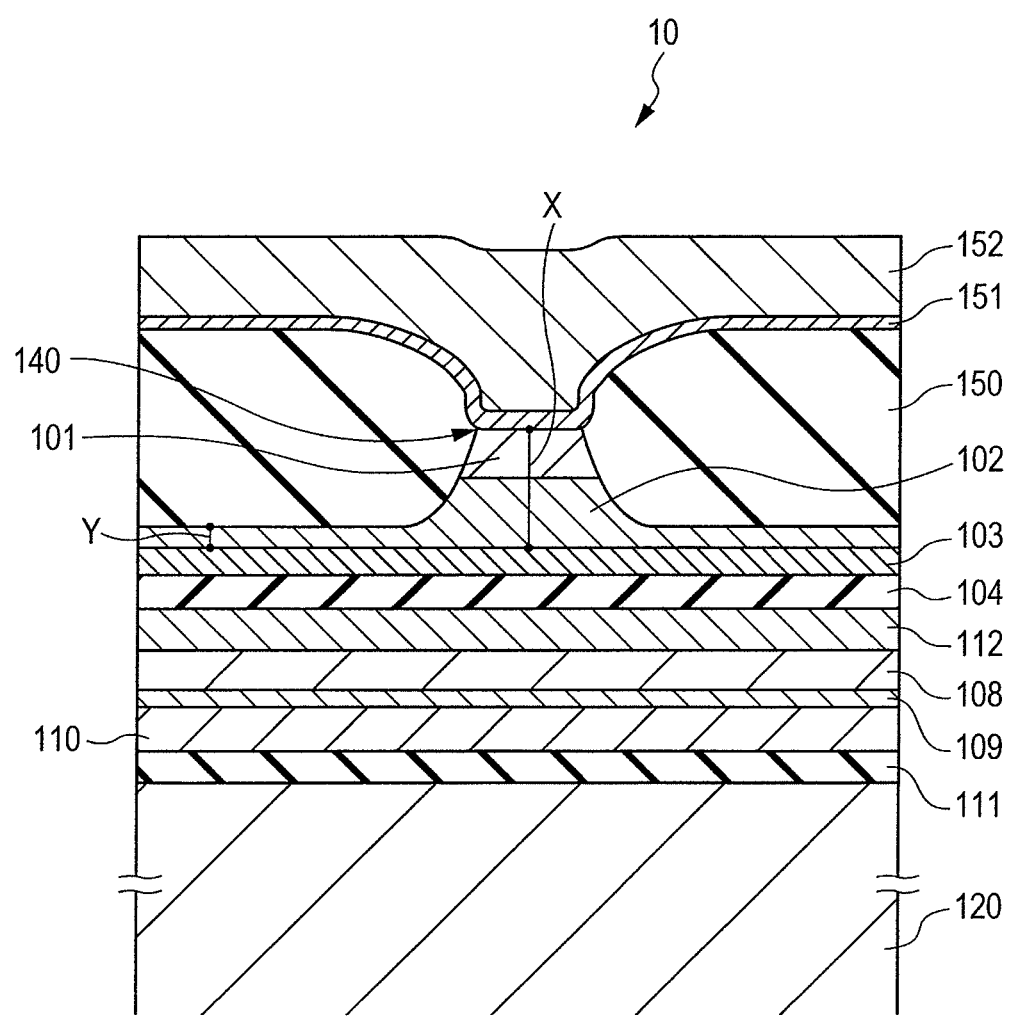
FIG. 1 is a schematic cross-sectional view of a microwave oscillator element according to one embodiment of the present invention.

Hereinafter, embodiments for carrying out the present invention will be described with reference to the drawings. Note that it is needless to say that the present invention is not limited to the embodiments. Moreover, in the drawings described below, the same reference numerals denote ones having the same function, and repetition of the description may be omitted in some cases.

FIG. 1 is a schematic cross-sectional view of a microwave oscillator element 10 according to the present invention.

The microwave oscillator element 10 includes a magnetoresistive element having: a magnetization free layer 103 whose magnetization direction is variable; a magnetization fixed layer 105 (a portion of an SAF 112 (see FIG. 7), unillustrated in FIG. 1) whose magnetization direction is fixed in one direction; and a tunnel barrier layer 104 interposed between the magnetization free layer 103 and the magnetization fixed layer 105. Further, the microwave oscillator element 10 includes: protection layers 101, 102 provided on the magnetization free layer 103 and configured to protect the magnetization free layer 103; electrodes 151, 152 provided on the protection layers 101, 102 and having a point contact section 140 where the electrodes 151, 152 are partially in electrical contact with the protection layers; and an interlayer insulating film 150 provided between the electrodes 151, 152 and the protection layers 101, 102 to prevent electrical contact at portions other than the point contact section 140. Specifically, in the microwave oscillator element 10, a substrate 120 that is a Si substrate, a $SiO_2$ layer 111, a lower electrode 110, a Ta layer 109, and a PtMn layer 108 are sequentially stacked. Moreover, stacked on the PtMn layer 108 is the SAF (Synthetic anti-ferri) layer 112 including a CoFe layer 107, a Ru layer 106, and the magnetization fixed layer 105 made of CoFeB (the CoFe layer 107, the Ru layer 106, and the magnetization fixed layer 105 are parts of the SAF 112 (see FIG. 7), unillustrated in FIG. 1). Further, stacked on the SAF 112 are sequentially the tunnel barrier layer 104 made of magnesium oxide (MgO), the magnetization free layer 103 made of CoFeB, the first protection layer 102 made of Ta, the second protection layer 101 made of Ru, the first electrode layer 151 made of Cr, and the second electrode layer 152 made of Au.

Note that, in this embodiment, Si is used for the substrate 120, which is however not limited thereto. It is possible to use various substrates such as, for example, a ceramic substrate, a glass substrate, a plastic substrate, and an organic film.

Figure 7:
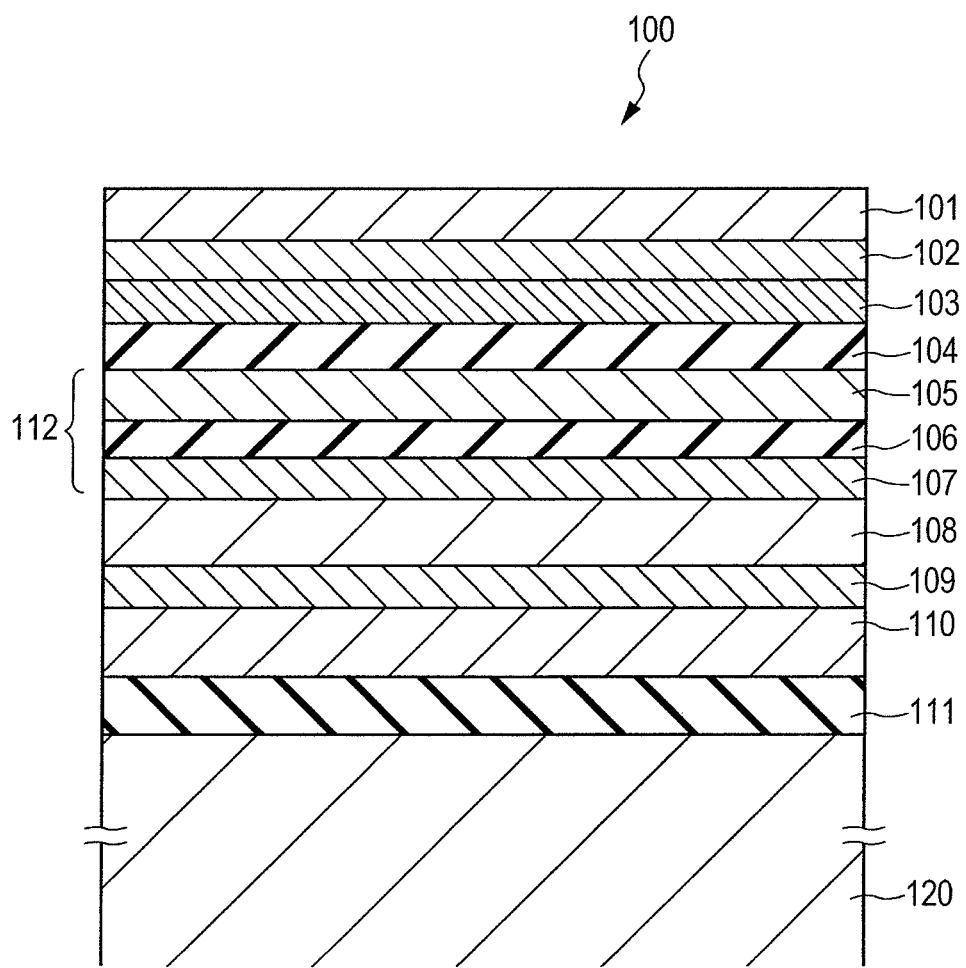
FIG. 7 is a cross-sectional view of a magnetoresistive thin film according to one embodiment of the present invention.

The magnetic material for the magnetization fixed layer 105 whose magnetization direction is fixed substantially in one direction is not limited to CoFeB. Examples thereof include ferromagnetic materials, such as NiFe and CoFe, containing magnetic elements such as Ni, Fe, and Co. As shown in FIG. 7, the magnetization direction of the magnetization fixed layer 105 is fixed by exchange coupling to the antiferromagnetic layer 108.

The material of the magnetization free layer 103 whose magnetization direction is variable is not limited to CoFeB. For example, it is also possible to use ferromagnetic materials, such as NiFe and CoFe, containing magnetic elements such as Ni, Fe, and Co.

In this embodiment, magnesium oxide (MgO) is used for the tunnel barrier layer 104 to obtain a high MR ratio, but not limited thereto. For example, it is also possible to use metal oxides such as alumina and titanium oxide.

Further, $SiO_2$ is used for the interlayer insulating film 150, but it is also possible to use, for example, $Al_2O_3$, AlN, air bridge, and so forth.

In this embodiment, the protection layers 101, 102 are formed as a laminate film including two layers, but are not limited thereto. For example, it is possible to adopt a single-layered protection layer, or a protection layer having a multilayer structure including two or more layers. Additionally, the material used for the protection layer is not limited to Ta and Ru. Any material can be used, as long as the material is conductive.

The microwave oscillator element 10 of this embodiment is characterized in that the area of an interface between the magnetization free layer 103 and the tunnel barrier layer 104 is larger than the contact area between the protection layer 101 and the electrode layer 151 (the surface area of the point contact section 140 (the area of an interface between the point contact section 140 and the protection layer 101)), more preferably larger by a factor of 2 or more. It is believed that this is to achieve a stable precession of the magnetization of the magnetization free layer 103. Further, in order to prevent the magnetization free layer 103 from coming into direct contact with the interlayer insulating film 150, at least the protection layer 102 is formed on the magnetization free layer 103.

Furthermore, the microwave oscillator element 10 of this embodiment is characterized in that a portion of the first protection layer 102 in contact with the interlayer insulating film 150 has a smaller thickness in a direction normal to a surface of the first protection layer 102 (stacking direction of the laminate of the microwave oscillator element 10) than a thickness that a portion of the protection layers 101, 102 in contact with the electrode layer 151 has in the surface normal direction (the above stacking direction). In FIG. 1, the film thickness of the portion indicated by Y is smaller than the film thickness of the portion indicated by X. In other words, the laminate of the protection layers 101, 102 is formed to have a raised portion, and a top surface (upper surface) of the raised portion is in contact with the point contact section 140 of the electrode layer 151. The raised portion is made to have a larger thickness in the stacking direction than a portion other than the raised portion of the laminate of the protection layers 101, 102. This makes it possible to relatively reduce the thickness Y of the protection layer 102 in an in-plane direction (direction parallel to an upper surface of the magnetization free layer 103) of the first protection layer 102, and to substantially increase the resistance to a current that would otherwise flow in a lateral direction in a region of the first protection layer 102 that is a portion of the protection layer in contact with the magnetization free layer 103, other than the region corresponding to the point contact section 140. Thus, the phenomenon that a metal protection layer acts as an electrical path can be suppressed.

Incidentally, it is needless to say that, for example, when only the protection layer 102 is used as a single protection layer, a portion of the protection layer 102 in contact with the electrode layer 151 should have a larger thickness in the surface normal direction than the other portions of the protection layer 102.

In this embodiment, the size of the point contact section 140 where the electrode is in contact with the protection layer is 50 nm×150 nm. However, the size of the point contact section 140 is not limited thereto. The size only needs to be 300 nm×500 nm or smaller, more preferably 100 nm×100 nm or smaller.

Figure 2:
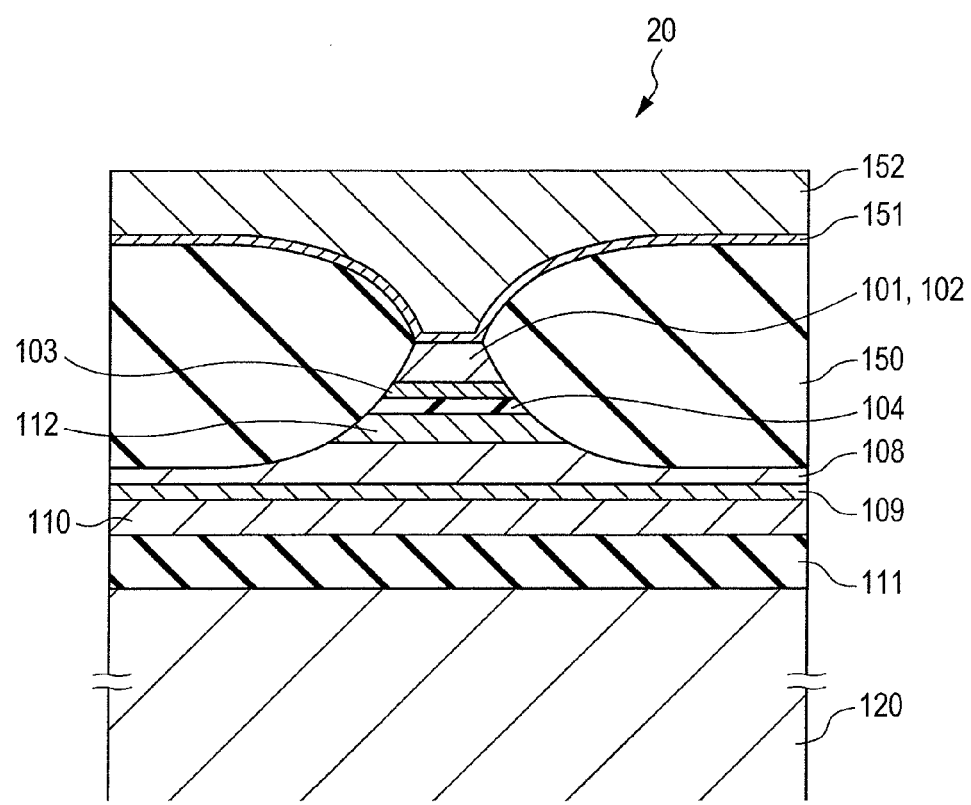
FIG. 2 is a view for explaining a structure of a microwave oscillator element as a first comparative example according to one embodiment of the present invention.

FIG. 2 is a view for explaining a structure of a microwave oscillator element 20 as a first comparative example of this embodiment.

The film configuration of the microwave oscillator element 20 is basically the same as the film configuration of the microwave oscillator element 10 of this embodiment shown in FIG. 1. The same reference numerals denote the same parts, and description of these will be omitted. However, in the microwave oscillator element 20 of the first comparative example in FIG. 2, the second protection layer 101, the first protection layer 102, the magnetization free layer 103, the tunnel barrier layer 104, and the SAF layer (magnetization fixed layer) 112 are removed by dry etching except for patterned portions of these; thus, a so-called pillar structure is formed. The size of the pillar structure is 50 nm×150 nm. Specifically, the area of the interface between the magnetization free layer 103 and the tunnel barrier layer 104 is approximately the same as the contact area between the protection layer 101 and the electrode layer 151 (the surface area of the point contact section 140).

Figure 3:
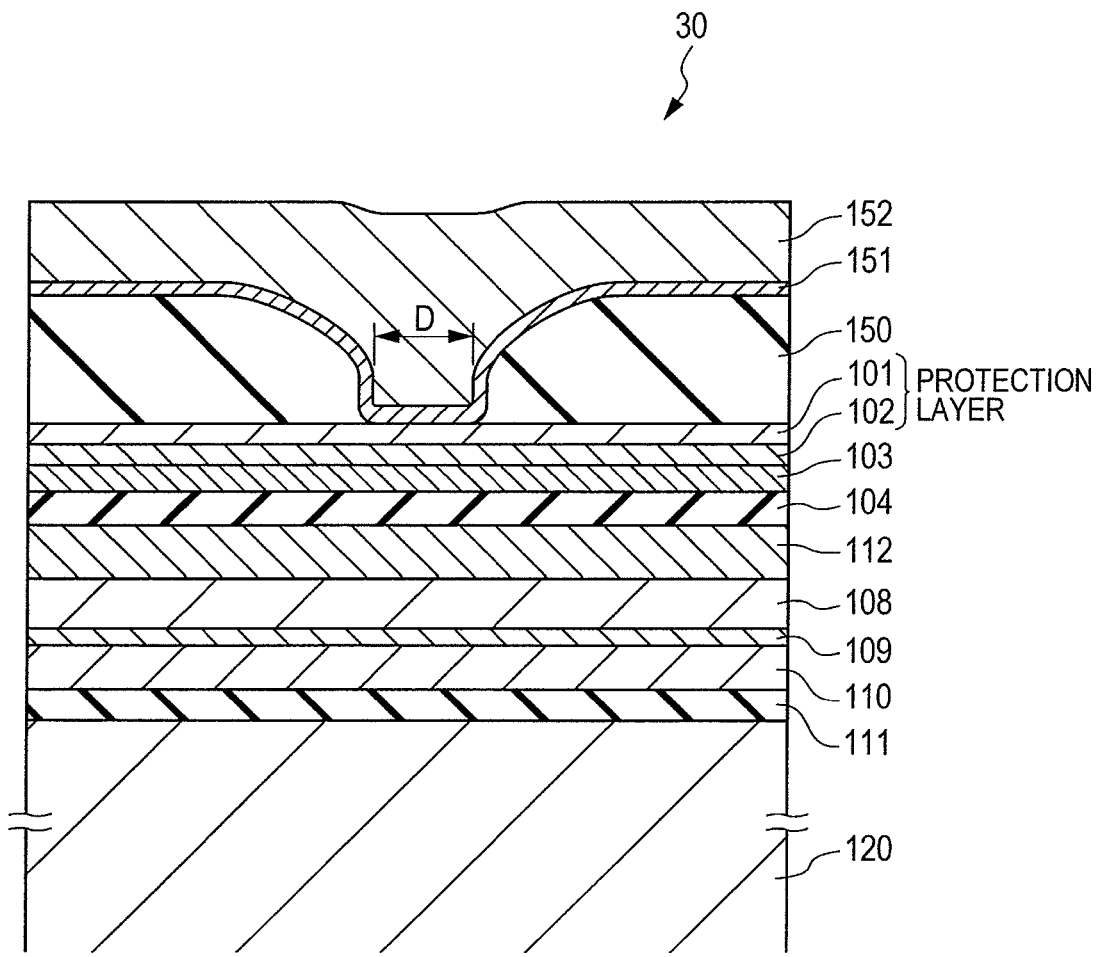
FIG. 3 is a view for explaining a structure of a microwave oscillator element as a second comparative example according to one embodiment of the present invention.

FIG. 3 is a view for explaining a structure of a microwave oscillator element 30 as a second comparative example of this embodiment.

The film configuration of the microwave oscillator element 30 is basically the same as the film configuration of the microwave oscillator element 10 of the present invention shown in FIG. 1. The same reference numerals denote the same parts, and description of these will be omitted. However, in the structure of the second comparative example, the electrode layers 151, 152 form a point contact section, while the protection layers 101, 102 do not form a point contact section. Specifically, in the microwave oscillator element 30 of the second comparative example, the thickness of a portion of the protection layer 101 in contact with the electrode layer 151 is equal to the thickness of a portion of the protection layer in contact with the interlayer insulating film made of $SiO_2$ (i.e., the protection layer is not removed by dry etching or the like). The size of the electrode layer 151 in contact with the protection layer is 50 nm×150 nm.

Figure 4:
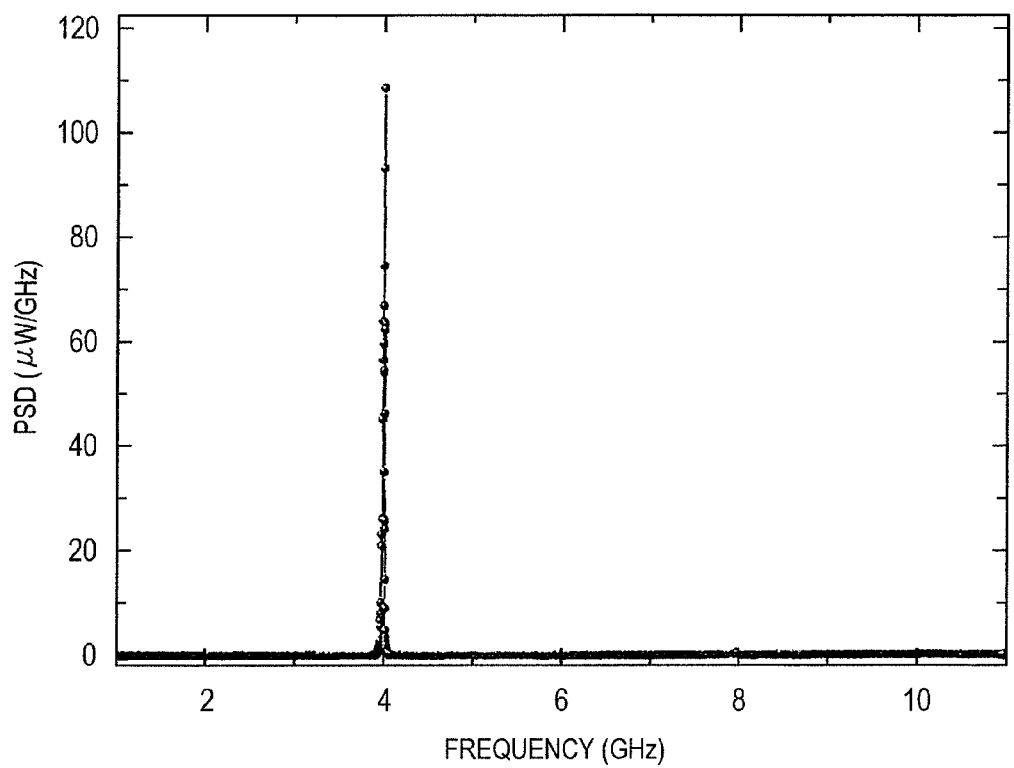
FIG. 4 is a graph showing the result of evaluating the microwave oscillator element shown in FIG. 1.

First, FIG. 4 shows the result of evaluating the microwave oscillator element 10 of this embodiment shown in FIG. 1. For the evaluation, the power spectrum density (PDS) is measured using a spectrum analyzer. During the measurement, an appropriate external magnetic field is applied to the microwave oscillator element 10. Moreover, a bias current of 7.2 mA for inducing a spin-transfer torque is applied to the upper electrode 152 and the lower electrode 110 of the microwave oscillator element 10.

An output power can be calculated by integrating the PSD curve shown in FIG. 4. In addition, a Q factor can be calculated by dividing a center frequency of PSD (frequency at which the maximum PSD value is shown) by an oscillation linewidth. As a result, the oscillation output of 2.43 microwatts and the Q factor of 350 were obtained. By using the microwave oscillator element 10 of this embodiment, the object of both an oscillation output in the order of microwatts and a high Q factor of 200 or higher can be achieved.

Figure 5:
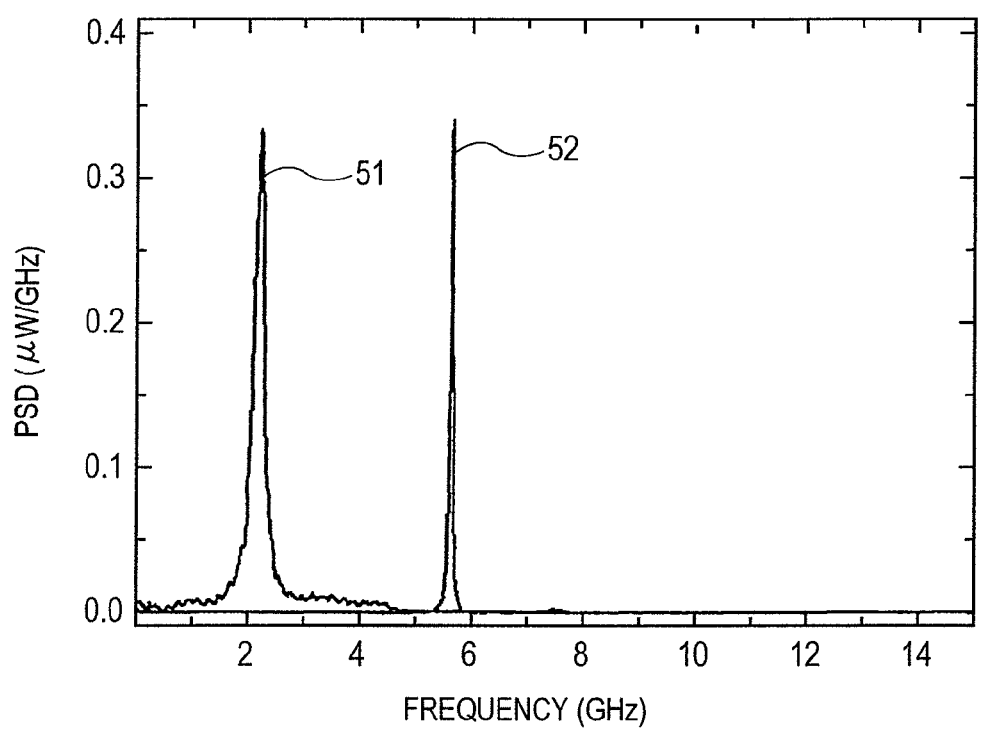
FIG. 5 is a graph showing the result of evaluating the microwave oscillator element of the first comparative example shown in FIG. 2.

Next, FIG. 5 shows the evaluation result by performing the same measurement as the PSD measurement shown in FIG. 4, using the microwave oscillator element 20 of the first comparative example shown in FIG. 2. The measurement method is basically the same as the above-described case of using the microwave oscillator element 10 of the present invention. However, reference numeral 51 indicates a spectrum showing the measurement result by applying an effective magnetic field of 50 Oe to the microwave oscillator element 20, and reference numeral 52 indicates a spectrum showing the measurement result by applying an effective magnetic field of 200 Oe to the microwave oscillator element 20. In the microwave oscillator element 20 of the first comparative example, when the output and the Q factor at the maximum oscillation output (reference numeral 51) are calculated from the graph, a relatively high output of 0.13 microwatts is obtained, but the Q factor is approximately 11. Both of a high oscillation output and a high Q factor are not achieved. Moreover, in the case of a Q factor of approximately 110 that is relatively high (reference sign 52), on the other hand, the oscillation output of only approximately 0.04 microwatts was obtained. Both a high oscillation output and a high Q factor are not similarly achieved.

Figure 6:
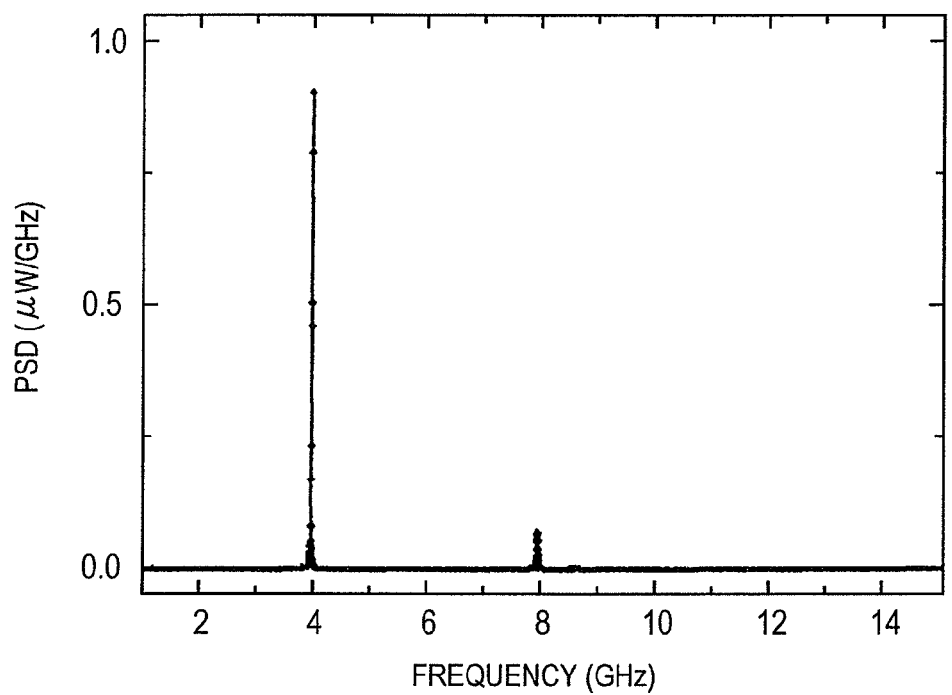
FIG. 6 is a graph showing the result of evaluating the microwave oscillator element of the second comparative example shown in FIG. 3.

Next, FIG. 6 shows the evaluation result by performing the same measurement as shown in FIG. 4, using the microwave oscillator element 30 of the second comparative example shown in FIG. 3. In the microwave oscillator element 30 of the second comparative example, the Q factor of approximately 280 is obtained, but the maximum oscillation output is only approximately 0.02 microwatts. Both of a high oscillation output and a high Q factor are not achieved.

It can be seen from these results that even when a magnetoresistive thin film of the same film configuration is used, it is difficult to achieve both a high oscillation output and a high Q factor when the magnetization free layer 103 is subjected to an etching process of dry etching, or when the thickness of a portion of the protection layer in contact with the electrode layer 151 is made equal to the thickness of a portion of the protection layer in contact with the interlayer insulating film 150 without the removal of the protection layers 101, 102, or other processing.

Next, a method for producing a microwave oscillator element 10 according to the present invention will be illustrated.

First, FIG. 7 shows a cross-sectional view of a magnetoresistive thin film used in the microwave oscillator element 10 of this embodiment. A magnetoresistive thin film 100 has a structure in which stacked are a substrate 120 made of Si, a $SiO_2$ layer 111, a lower electrode 110, a Ta (5 nm) layer 109, a PtMn (15 nm) layer 108, a $Co_{70}Fe_{30}$ (2 nm) layer 107, a Ru (0.85 nm) layer 106, a magnetization fixed layer 105 made of $(Co_{70}Fe_{30})_{80}B_{20}$ (3 nm), a tunnel barrier layer 104 made of MgO (1.1 nm), a magnetization free layer 103 made of $Co_{40}Fe_{40}B_{20}$ (1.7 nm), a first protection layer 102 made of Ta (8 nm), and a second protection layer 101 made of Ru (7 nm).

Reference numeral 112 represents so-called antiferromagnetic interlayer exchange coupling (SAF) having the $(Co_{70}Fe_{30})_{80}B_{20}$ (3 nm) layer 105, the Ru (0.85 nm) layer 106, and the $Co_{70}Fe_{30}$ (2 nm) layer 107. The magnetization direction of the $Co_{70}Fe_{30}$ (2 nm) layer 107 is fixed by exchange coupling to the antiferromagnetic layer of the PtMn (15 nm) 108. In this magnetoresistive thin film 100, the SAF 112 functions as a magnetization fixed layer, while the $Co_{40}Fe_{40}B_{20}$ (1.7 nm) layer 103 functions as a magnetization free layer.

Each layer of the magnetoresistive thin film 100 described above is formed by using a sputtering method. Alternatively, each layer may be formed by other methods (for example, vapor deposition or the like), or a substrate having a laminate as shown in FIG. 7 may be produced in advance as a stock. Thus, a substrate having a laminate shown in FIG. 7 is prepared.

The formed magnetoresistive thin film 100 is exposed to air in vacuum device, and an organic resist is applied thereto for patterning. Accordingly, the magnetization free layer 103 is chemically damaged by oxidation or the like. This causes deterioration of magnetic properties and magnetoresistance ratio. To prevent or reduce this chemical damage, the protection films 101, 102 are provided on the magnetization free layer 103.

Nevertheless, in this embodiment, a two-layered laminate film is formed as the protection layers 102, 101, which are not however limited thereto. For example, it is possible to adopt a single-layered protection layer or a protection layer having a multilayer structure including two or more layers. Additionally, the material used for the protection layer is not limited to Ta and Ru. Any material can be used, as long as the material is conductive.

In the microwave oscillator element 10, a magnetoresistive thin film having a high MR ratio is preferably used to obtain a high oscillation output. For this reason, in this embodiment, magnesium oxide (MgO) is used for the tunnel barrier layer 112. Nevertheless, the material is not limited thereto, and metal oxides such as, for example, alumina and titanium oxide can also be used for the tunnel barrier layer 112 of the magnetoresistive element necessary in the present invention.

Moreover, since the application of the microwave oscillator element of this embodiment is mainly near the microwave band, it is preferable that impedance matching be achieved between the microwave oscillator element and a transmission line, other electronic components, and so forth. For example, in a case where the transmission system is of approximately 50Ω, the impedance magnetoresistive element is preferably of approximately 50Ω, also.

Figure 8:
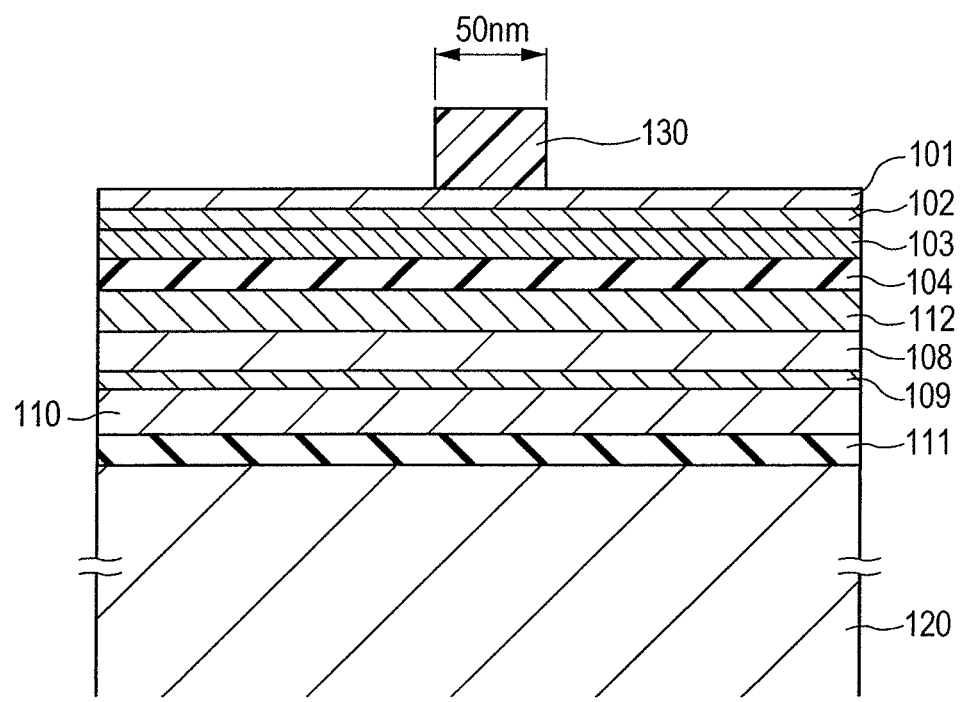
FIG. 8 is a view for explaining a method for producing a microwave oscillator element according to one embodiment of the present invention.

As shown in FIG. 8, after the magnetoresistive thin film 100 is produced, a pattern 130, which serves as a point contact section 140 later, is formed on the magnetoresistive thin film 100 using EB lithography. Specifically, the EB resist 130 is formed as a mask layer on a region of the second protection layer 101 corresponding to the point contact section 140, that is, a region having an area smaller than the interface between the magnetization free layer 103 and the tunnel barrier layer 104. The pattern size is 50×150 nm, and the thickness of the resist is approximately 300 nm.

Next, using this resist pattern 130 as a mask, the protection layers 101, 102 are dry-etched. Dry etching is performed to etch portions of the protection layers 101, 102 in such a manner that a region of the laminate where the protection layers 101, 102 are in contact with the point contact section 140 of electrode layers 151, 152 has a larger thickness in a stacking direction than the other regions thereof. In other words, the laminate of the protection layers is dry-etched in such a manner that the regions other than the region of the laminate of the protection layers where the EB resist 130 is formed become smaller in thickness in the stacking direction than the region of the laminate of the protection layer where the EB resist 130 is formed. Note that it is necessary not to expose the magnetization free layer 103 from the protection layers 101, 102. Thus, the etching is performed in such a manner that the protection layers 101, 102 remain at least on the entire surface of the magnetization free layer 103 on the protection layers 101, 102 side. As the dry etching, an Ar ion milling process is employed. In this event, the etching depth is controlled by adopting secondary ion-microprobe mass spectrometry (SIMS).

Figure 9:
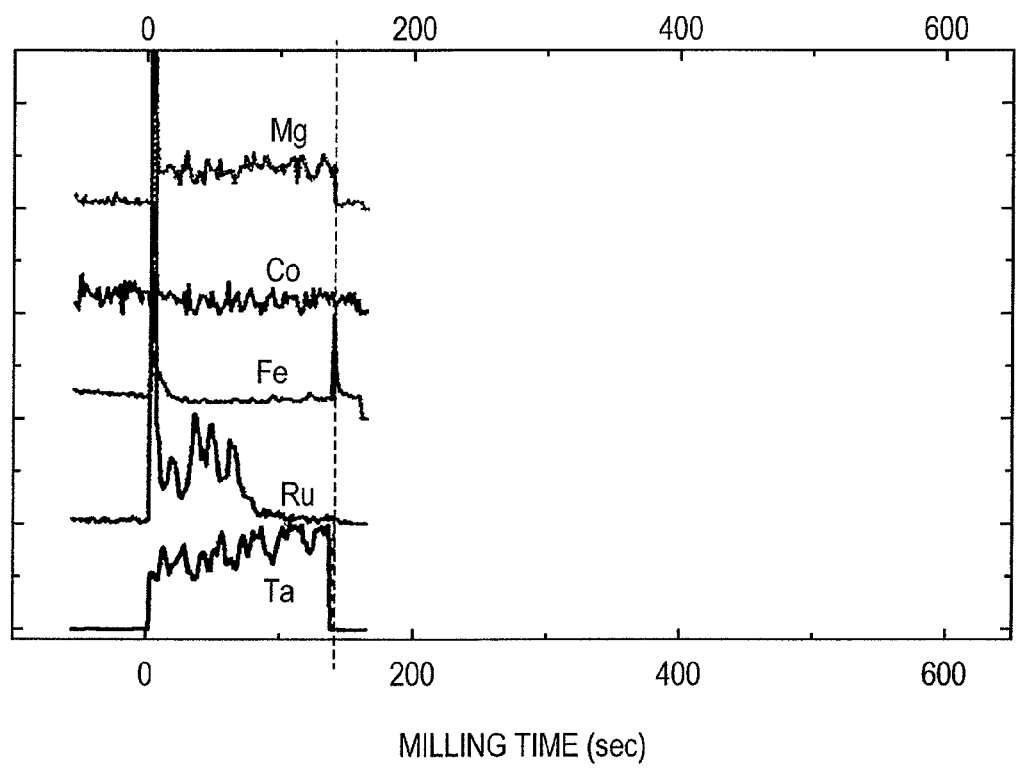
FIG. 9 is a graph for illustrating SIMS spectra measured during etching of a magnetoresistive thin film according to one embodiment of the present invention.

FIG. 9 shows SIMS (Secondary Ion-microprobe MassSpectrometer) spectra measured during the etching of the magnetoresistive thin film 100.

Figure 10:
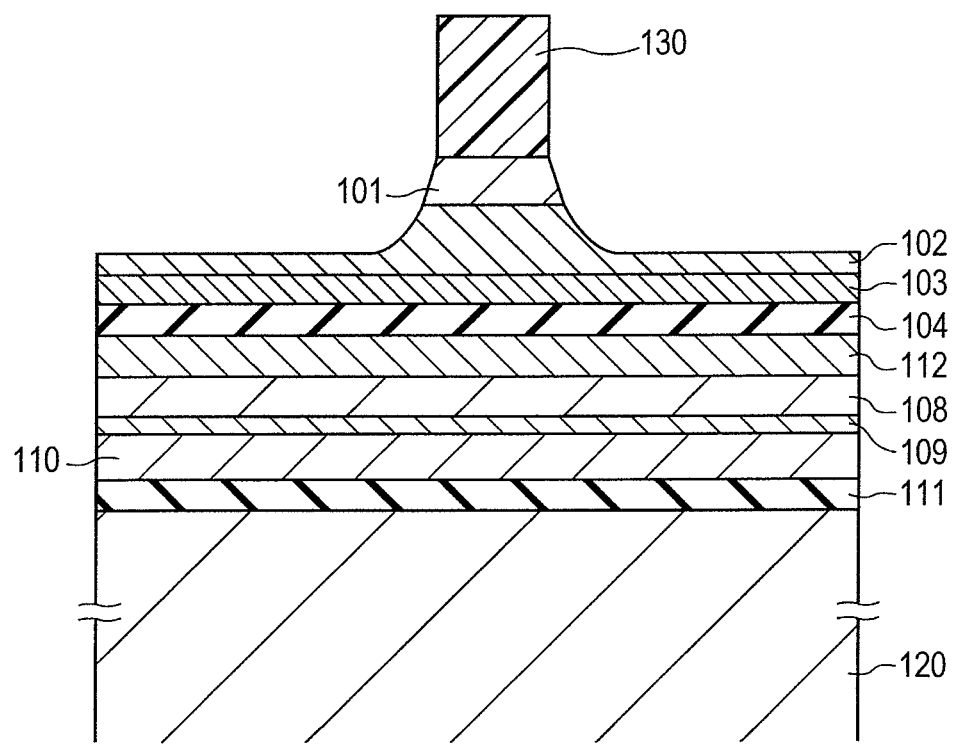
FIG. 10 is a view for explaining the method for producing a microwave oscillator element according to one embodiment of the present invention.

In this way, in this embodiment, by adopting secondary ion-microprobe mass spectrometry, the dry etching can be precisely completed after the removal from the second protection layer 101 to a middle of the first protection layer 102. Specifically, as shown in FIG. 10, the etching can be performed in such a manner that a portion (a region having a surface coming into contact with the point contact section 140) of the laminate of the protection layers 101, 102 where the EB resist 130 is deposited is left in a raised shape, while portions other than the raised portion becomes relatively thin.

Next, a $SiO_2$ film is formed, which serves as an interlayer insulating film 150. Specifically, the interlayer insulating film 150 is formed in such a manner that the interlayer insulating film 150 covers at least surfaces of the protection layers 101, 102 exposed by the etching. Thus, removing the EB resist 130 from the second protection layer 101 exposes only the surface of the second protection layer 101, which comes into contact with the point contact section 140 of the electrode layers 151, 152. This makes it possible to easily obtain a configuration in which the upper surface of the second protection layer 101 comes into contact with the point contact section 140 in forming the electrode layer 151 later.

Figure 11:
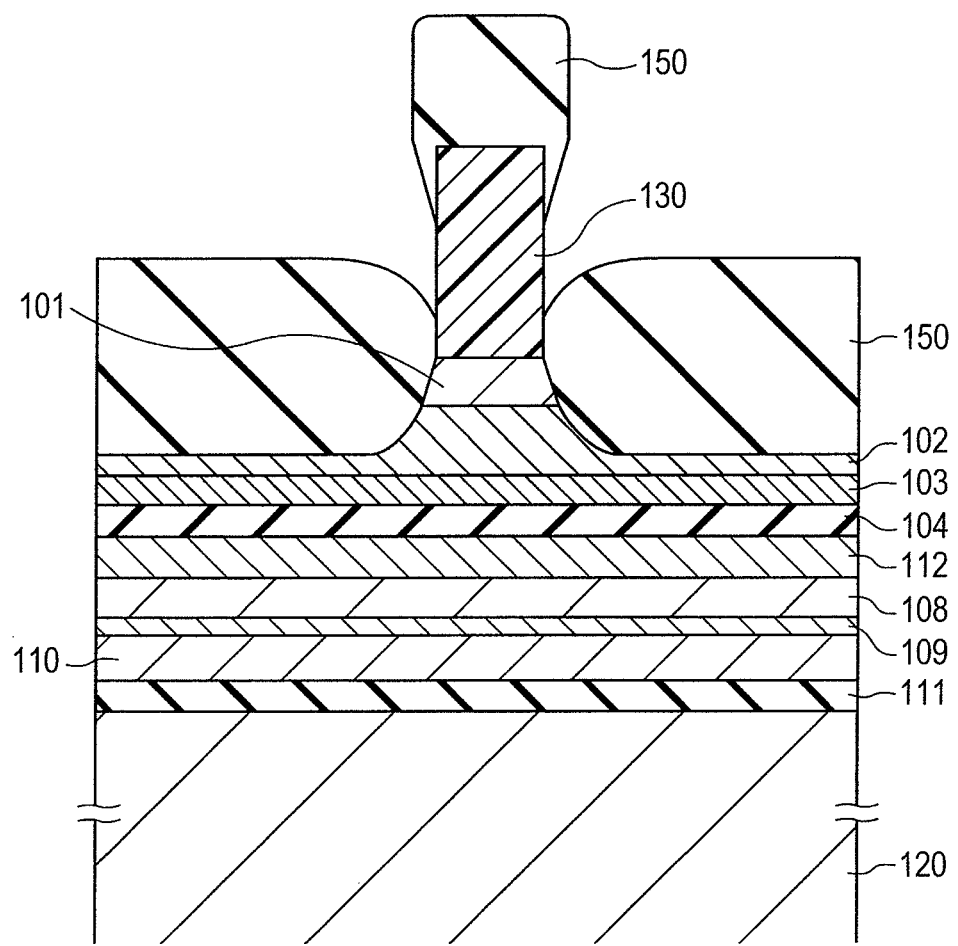
FIG. 11 is a view for explaining the method for producing a microwave oscillator element according to one embodiment of the present invention.

In this embodiment, the thickness of the interlayer insulating layer 150 is determined in consideration of impedance matching with the 50-Ω transmission line. FIG. 11 shows this state.

Figure 12:
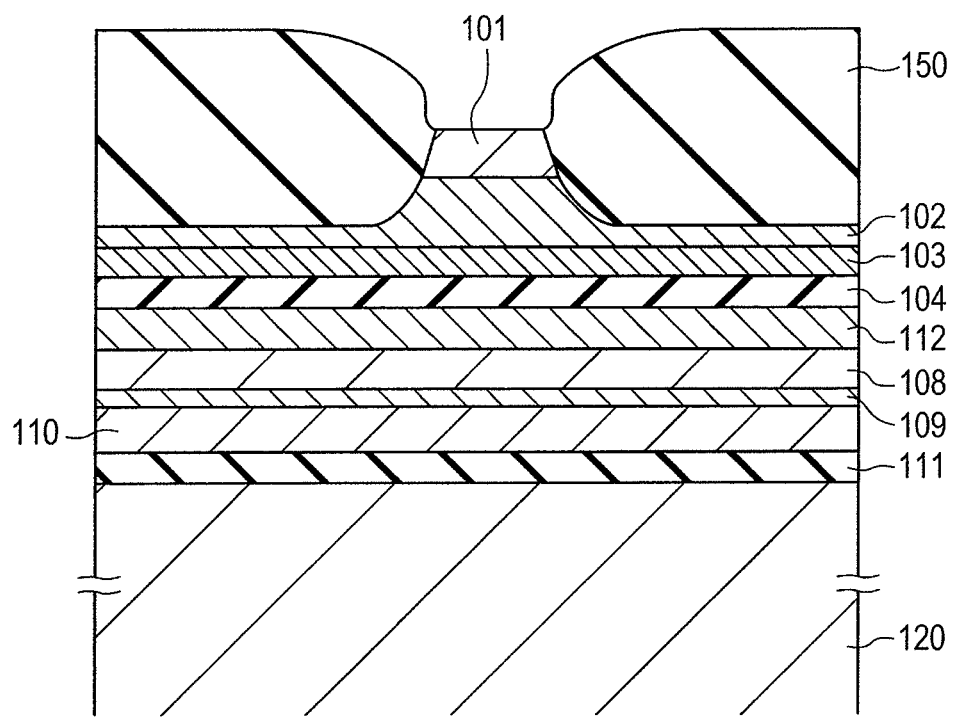
FIG. 12 is a view for explaining the method for producing a microwave oscillator element according to one embodiment of the present invention.

Next, as shown in FIG. 12, in order to produce the contact between the magnetoresistive thin film and the upper electrodes, the resist 130 and the $SiO_2$ layer 150 stacked on the resist 130 are removed by a lift off method. In the lift off method, NMP heated at several tens of ° C. is sprayed in a jetting manner onto the substrate.

Figure 13:
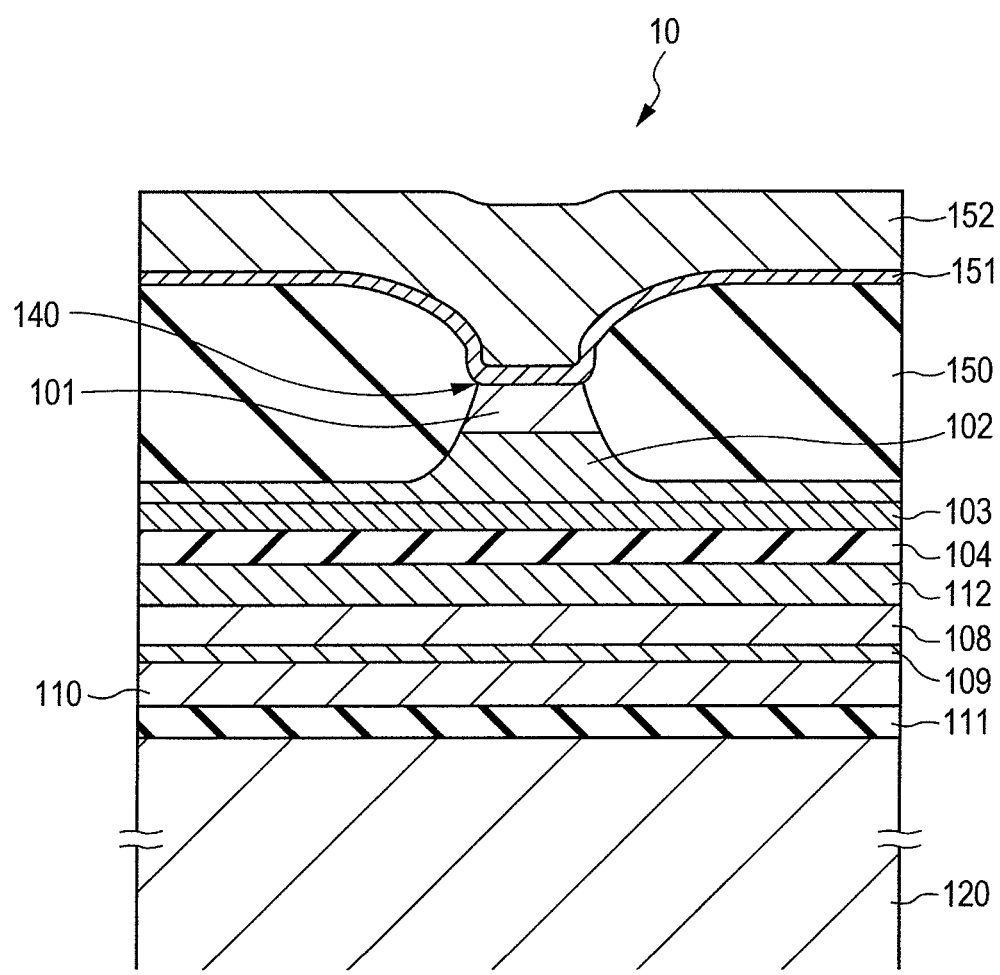
FIG. 13 is a view for explaining the method for producing a microwave oscillator element according to one embodiment of the present invention.

Thereafter, as shown in FIG. 13, films of the upper electrodes 151, 152 are formed on the second protection layer 101 and the interlayer insulating layer 150 by sputtering. Thereby, the electrodes 151, 152 are formed, in which a portion coming into contact with the region of the second protection layer 101 where the EB resist 130 has been formed becomes the point contact section 140. In this embodiment, Ru is used for the second protection layer 101 located on the outermost surface. This brings about advantages that even if oxidized by exposure to air, the second protection layer 101 becomes a conductive oxide, not lowering the electric resistance. By using a metal that becomes a conductive oxide as the outermost surface of the protection layer, a favorable electrical contact with the upper electrode can be easily obtained. In a case where a conductive oxide is not used, a measure should be taken for example to remove an oxide layer on the protection layer surface by a method such as dry etching before the upper electrode layer is formed.

First, a film of the electrode 152 is formed on the second protection layer 101 by sputtering. Next, a film of the upper electrode 152 is formed on the second protection layer 101 by sputtering. Although Au is used for the upper electrode 152, the electrode layer 151 made of Cr is inserted as a buffer layer to improve the film adhesiveness. In this embodiment, the Cr/Au combination is used for the upper electrodes. However, the materials are not limited thereto, as long as a favorable electrical contact can be obtained. FIG. 13 shows the state after the upper electrodes are formed.

In the microwave oscillator element 10 thus produced, the magnetization free layer 103 is not etched. Accordingly, the magnetization free layer 130 is not chemically damaged, and there is no shape magnetic anisotropy in an in-plane direction attributable to the shape of the element, also. For this reason, the point contact structure for passing a current is formed above the magnetization free layer 103 to thereby suppress a phenomenon that a metal protection film acts as an electrical path in which a current flows laterally, and it is believed that an expected state can be obtained.

Figure 14:
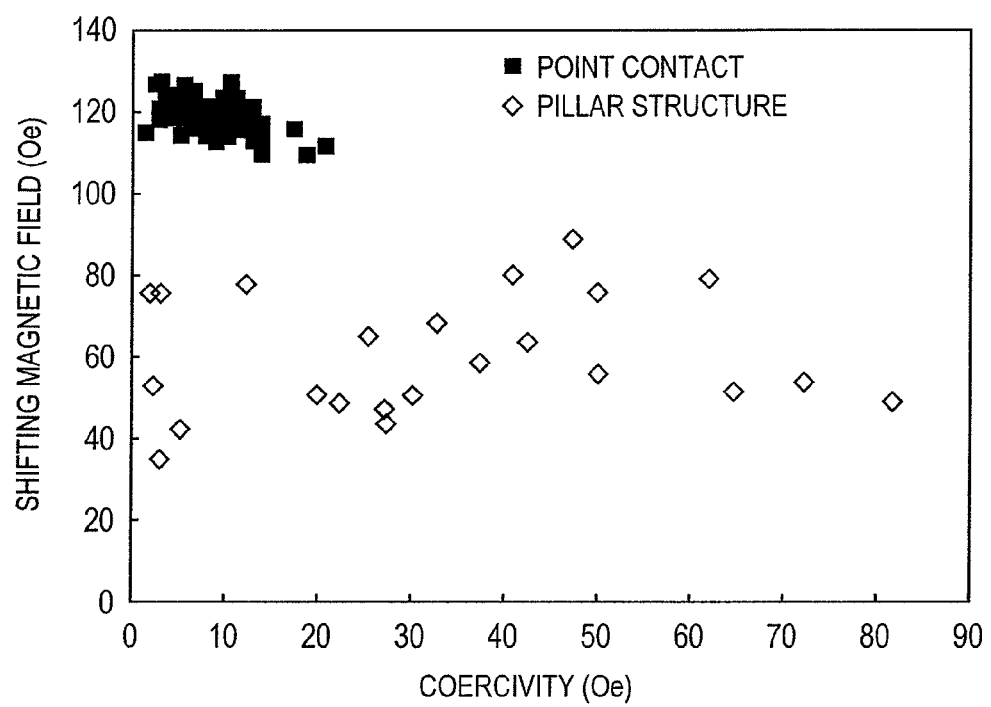
FIG. 14 is a graph for explaining the relation between magnetic field shift and coercivity for comparison of the oscillator element of one embodiment of the present invention with the oscillator element of the comparative example.

Moreover, the oscillator element of this embodiment is advantageous in terms of production also. FIG. 14 shows the relation between magnetic field shift and coercivity for comparison of a microwave oscillator element 20 having several pillar structures on a substrate with the microwave oscillator element 10 according to this embodiment.

The microwave oscillator element 20 having pillar structures of the comparative example has considerably large variations in magnetic field shift and coercivity. Meanwhile, the microwave oscillator element 0 having a point contact structure according to this embodiment has small variations in magnetic field shift and coercivity. The result obtained is similar to the variations of a flat film. The reason is believed to be because the magnetization free layer is not etched in the case of the oscillator element according to this embodiment; hence, the magnetization free layer does not vary in shape and is not damaged by oxidation or the like. In other words, it can be said that the variations in the magnetic properties hardly include a variation due to patterning and a variation due to etching, which would otherwise occur during the production process.

Additionally, the microwave oscillator element of the present invention may also be used as a magnetic sensor.

In the above-described embodiments, two layers of the Ta layer and the Ru layer are provided as the protection layers. However, the protection layer is not limited thereto, and may be a single layer. Similarly, two layers of the Cr layer and the Au layer are provided as the electrode layer. However, the electrode layer is not limited thereto, and may be a single layer.

The invention claimed is:

1. An oscillator element comprising:
   a magnetoresistive element having:
      a magnetization free layer whose magnetization direction is variable,
      a magnetization fixed layer whose magnetization direction is fixed in one direction, and
      a tunnel barrier layer interposed between the magnetization free layer and the magnetization fixed layer;
   a first protection layer provided on and in contact with the magnetization free layer;
   a second protection layer provided on and in contact with the first protection layer;
   an electrode provided on the second protection layer in such a manner that the second protection layer is arranged between the first protection layer and the electrode, and the electrode is electrically contacted with the second protection layer; and
   an interlayer insulating film provided between the first protection layer and the electrode in such a manner that the electrode has a point contact section where the electrode is partially in electrical contact with the second protection layer,
   wherein an area of an interface between the second protection layer and the electrode is smaller than an area of an interface between the first protection layer and the magnetization free layer,
   wherein a portion of the first protection layer in contact with the interlayer insulating film has a smaller thickness in a surface normal direction than a portion of the first protection layer in contact with the second protection layer, wherein a laminate of the first protection layer and the second protection layer is formed to have a raised portion, wherein an upper surface of the raised portion is electrically contacted with the point contact section of the electrode, and wherein a portion of the laminate other than the raised portion has a smaller thickness in a surface normal direction than the raised portion in a surface normal direction.

2. The oscillator element according to claim 1, wherein an area of an interface between the magnetization free layer and the tunnel barrier layer is larger than an area of an interface between the point contact section and the second protection layer.

3. The oscillator element according to claim 1, wherein the area of the interface between the second protection layer and the electrode is smaller than an area of an interface between the first protection layer and the second protection layer.

4. A method for producing an oscillator element comprising the steps of:

forming a mask layer over a substrate, the substrate having:
a magnetoresistive element having a magnetization free layer whose magnetization direction is variable, a magnetization fixed layer whose magnetization direction is fixed in one direction, and a tunnel barrier layer interposed between the magnetization free layer and the magnetization fixed layer,
a first protection layer stacked on and in contact with the magnetization free layer, and
a second protection layer stacked on and in contact with the first protection layer,
where the mask layer is being formed on a region of the second protection layer having a smaller area than an interface between the first protection layer and the second protection layer;

patterning the second protection layer using the mask layer as a mask, and etching the first protection layer in such a manner that a region of the first protection layer other than a region where the second protection layer is formed has a smaller thickness in a stacking direction of the magnetoresistive element and the first protection layer than the region of the first protection layer where the second protection layer is formed, where a laminate of the first protection layer and the second protection layer is formed to have a raised portion, and a portion of the laminate other than the raised portion has a smaller thickness in a surface normal direction than the raised portion in a surface normal direction;

forming an interlayer insulating film on the mask layer and a portion of the first protection layer exposed by the etching;

removing the mask layer with the interlayer insulation film present on the mask layer; and forming an electrode in such a manner as to form a point contact section at a portion in contact with a region of the second protection layer exposed by removing the mask layer, where an upper surface of the raised portion is electrically contacted with the point contact section of the electrode.

5. An oscillator element comprising:
a magnetoresistive element having:
a magnetization free layer whose magnetization direction is variable,
a magnetization fixed layer whose magnetization direction is fixed in one direction, and
a tunnel barrier layer interposed between the magnetization free layer and the magnetization fixed layer;
a protection layer of a single film provided on and in contact with the magnetization free layer;
an electrode provided on the protection layer and having a point contact section where the electrode is partially in electrical contact with the protection layer; and
an interlayer insulating film provided between the protection layer and the electrode except for the point contact section,
wherein a portion of the protection layer in contact with the interlayer insulating film has a smaller thickness in a surface normal direction than a portion of the protection layer in contact with the point contact section of the electrode,
wherein the protection layer has a raised portion,
wherein an upper surface of the raised portion is electrically contacted with the point contact section of the electrode, and
wherein a portion of the protection layer other than the raised portion has a smaller thickness in a surface normal direction than the raised portion in a surface normal direction.

6. The oscillator element according to claim 5, wherein an area of an interface between the magnetization free layer and the tunnel barrier layer is larger than an area of an interface between the point contact section and the protection layer.

* * * * *